(12) United States Patent
Liu et al.

(10) Patent No.: US 7,598,147 B2
(45) Date of Patent: Oct. 6, 2009

(54) METHOD OF FORMING CMOS WITH SI:C SOURCE/DRAIN BY LASER MELTING AND RECRYSTALLIZATION

(75) Inventors: Yaocheng Liu, White Plains, NY (US); Qiqing C. Ouyang, Yorktown Heights, NY (US); Kathryn T. Schonenberg, Wappingers Falls, NY (US); Chun-Yung Sung, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/860,127

(22) Filed: Sep. 24, 2007

(65) Prior Publication Data
US 2009/0081836 A1 Mar. 26, 2009

(51) Int. Cl.
*H01L 21/336* (2006.01)
(52) U.S. Cl. ............... 438/305; 257/204; 257/E21.454; 257/E21.619
(58) Field of Classification Search ................. 438/199, 438/305, 308, 482, 486, 162, 514, 520, 522; 257/204, E21.454, E21.466, E21.619
See application file for complete search history.

(56) References Cited
U.S. PATENT DOCUMENTS
2007/0269951 A1* 11/2007 Lu et al. .................... 438/301
2008/0160683 A1* 7/2008 Vanderpool et al. ......... 438/142

OTHER PUBLICATIONS

Ang, K.W., et al., "Enhanced Performance in 50 nm N-MOSFETs with Silicon-Carbon Source/Drain Regions", IEDM Tech Dig., pp. 1069-1071, 2004.

* cited by examiner

*Primary Examiner*—Quoc D Hoang
(74) *Attorney, Agent, or Firm*—Scully, Scott, Murphy & Presser, P.C.; Louis J. Percello, Esq.

(57) ABSTRACT

A method of forming crystalline Si:C in source and drain regions is provided. After formation of shallow trench isolation and gate electrodes of field effect transistors, gate spacers are formed on gate electrodes. Preamorphization implantation is performed in the source and drain regions, followed by carbon implantation. The upper portion of the source and drain regions comprises an amorphous mixture of silicon, germanium, and/or carbon. An anti-reflective layer is deposited to enhance the absorption of a laser beam into the silicon substrate. The laser beam is scanned over the silicon substrate including the upper source and drain region with the amorphous mixture. The energy of the laser beam is controlled so that the temperature of the semiconductor substrate is above the melting temperature of the amorphous mixture but below the glass transition temperature of silicon oxide so that structural integrity of the semiconductor structure is preserved.

20 Claims, 14 Drawing Sheets

METHOD OF FORMING CMOS WITH SI:C SOURCE/DRAIN BY LASER MELTING AND RECRYSTALLIZATION

FIELD OF THE INVENTION

The present invention relates to methods of manufacturing semiconductor structures, and more particularly to methods of manufacturing embedded regions of carbon-substituted single crystal silicon (Si:C) by a low temperature laser anneal.

BACKGROUND OF THE INVENTION

Various techniques for enhancing semiconductor device performance through manipulation of carrier mobility have been investigated in the semiconductor industry. One of the key elements in this class of technology is the manipulation of stress in the channel of transistor devices. Some of these methods utilize a carbon-substituted single crystal silicon (Si:C) layer within a silicon substrate to change the lattice constant of the silicon material in the channel. While both silicon and carbon have identical electronic outer shells and the same crystal structure, that is, "the diamond structure," their room temperature lattice constants are different with values of 0.5431 nm and 0.357 nm, respectively. By substituting some of the silicon atoms in a single crystalline silicon lattice with carbon atoms, a single crystal structure with a smaller lattice constant than that of pure silicon may be obtained.

To increase the amount of stress on adjoining semiconductor structures, it is necessary to increase the carbon content. In other words, the higher the carbon content in an Si:C layer, the higher the stress on adjoining structures. Incorporation of carbon atoms into a silicon substrate during the manufacture of silicon substrates is generally very difficult due to the low equilibrium solubility of carbon ($3.5 \times 10^{17}/cm^3$ or 7 ppm in atomic concentration) at the melting point of silicon. Practically, carbon cannot be incorporated into the silicon substrates during the growth of silicon ingot.

Ang et al., "Enhanced Performance in 50 nm N-MOSFETs with Silicon-Carbon Source/Drain Regions," IEDM Tech Dig., pages 1069-1071, 2004, discloses a method of incorporating carbon atoms into a semiconductor substrate using selective epitaxy. Epitaxial silicon carbon alloy regions are formed within the source and drain regions with a carbon mole fraction at 1.3%, inducing a lattice mismatch of about 0.65%, thereby inducing both a horizontal tensile strain and vertical compressive strain in the silicon channel region. The resulting N-MOSFET displays an increase of up to about 40% in transconductance.

Such techniques may be employed to induce a local tensile uniaxial stress in an N-MOSFET channel to increase the mobility of electrons in the channel, and consequently, the transconductance of the N-MOSFET. However, epitaxial growth of a silicon carbon alloy is prone to defect generation due to a large lattice mismatch between silicon atoms and carbon atoms. Crystalline defects, such as vacancies, interstitials, and dislocations, scatter electronic carriers and cause degradation of conductivity in the source and drain regions, resulting in reduced on-current and increased leakages of MOSFET devices.

Further, semiconductor devices may comprise elements that are susceptible to excessive heating. For example, a silicon substrate may not be heated to a temperature close to the melting temperature of silicon of about 1428° C. without compromising the structural integrity of the silicon substrate. A silicon substrate containing a silicon dioxide structure, i.e., a structure comprising silica, may not be heated to a glass transition temperature of about 1200° C. without exposing the silicon dioxide structure to structural degradation, e.g., deformation. Therefore, the temperature of thermal processes needs to be as low as possible to maintain structural integrity of existing semiconductor structures.

Therefore, there exists a need for methods of fabricating embedded regions of low defect, high carbon concentration Si:C layer within a semiconductor substrate.

There also exists a need for methods of fabricating such embedded regions without adversely affecting other regions of the semiconductor substrate, specifically by avoiding an excessive heating of the semiconductor substrate.

SUMMARY OF THE INVENTION

To address the needs described above, the present invention provides a method of forming crystalline Si:C in source and drain regions. After formation of shallow trench isolation and gate electrodes of field effect transistors, gate spacers are formed on gate electrodes. A preamorphization implantation is performed in the source and drain regions, followed by carbon implantation. The upper portion of the source and drain regions comprises an amorphous mixture of silicon, carbon, and optionally germanium. An anti-reflective layer is deposited to enhance the absorption of a laser beam into the silicon substrate. The laser beam is scanned over the silicon substrate including the upper source and drain regions containing the amorphous mixture. The energy of the laser beam is controlled so that the temperature of the semiconductor substrate is above the melting temperature of the amorphous mixture, but below the glass transition temperature of silicon oxide, the melting point of polycrystalline silicon alloy, and the melting point of crystalline silicon, so that structural integrity of the semiconductor structure is preserved.

According to an aspect of the present invention, a method of forming a semiconductor structure is provided, which comprises:

forming a gate conductor on a semiconductor substrate comprising a silicon containing material;

amorphizing a region of the semiconductor substrate by implanting atoms of an amorphizing species;

implanting carbon atoms into the region to form an amorphous alloy comprising silicon and carbon; and annealing the semiconductor substrate with a laser anneal, wherein the amorphous alloy is melted and recrystallized at a temperature below the glass transition temperature of silicon oxide.

Preferably, the temperature is below a melting point of a polycrystalline silicon alloy, and a melting point of crystalline silicon.

In an embodiment, a crystallized alloy formed from the amorphous alloy may apply a substantially radial tensile stress to surrounding regions.

According to another aspect of the present invention, another method of forming a semiconductor structure is provided that comprises:

forming at least one p-type field effect transistor (PFET) and at least one n-type field effect transistor (NFET) on a semiconductor substrate comprising a silicon containing material;

amorphizing an upper portion of source and drain regions of the at least one NFET by implanting atoms of an amorphizing species;

implanting carbon atoms into the upper portion of the source and drain regions to form an amorphous alloy comprising silicon and carbon; and annealing the semiconductor substrate with a laser anneal, wherein the amorphous alloy is melted and recrystallized at a temperature below the glass transition temperature of silicon oxide.

The crystallized alloy may apply a uniaxial tensile stress to at least one channel of the at least one NFET. The magnitude of the uniaxial tensile stress on the at least one channel of the at least one NFET has a magnitude of about 500 MPa or greater.

The method may further comprise forming an etch stop oxide abutting the upper portion of source and drain regions and forming a nitride spacer on each of the at least one PFET and the at least one NFET.

In both methods, the temperature of the annealing may be in the range from about 1,100° C. to about 1,200° C., and preferably in the range from about 1,125° C. to about 1,175° C. The amorphizing species may be selected from the group consisting of silicon and germanium. The amorphous alloy may comprise at least 0.5% of carbon in atomic concentration. The methods may further comprise forming shallow trench isolation comprising silicon oxide prior to the annealing.

The inventive methods may also further comprise forming an anti-reflective layer prior to the annealing. The anti-reflective layer may comprise a silicon oxide layer having a thickness from about 30 nm to about 100 nm. The inventive methods may even further comprise removing the anti-reflective layer after the annealing of the semiconductor substrate. Gate spacers may be formed prior to the forming of the anti-reflective layer, wherein the anti-reflective layer abuts the gate spacers.

DETAILED DESCRIPTION OF THE INVENTION

Figure 1:
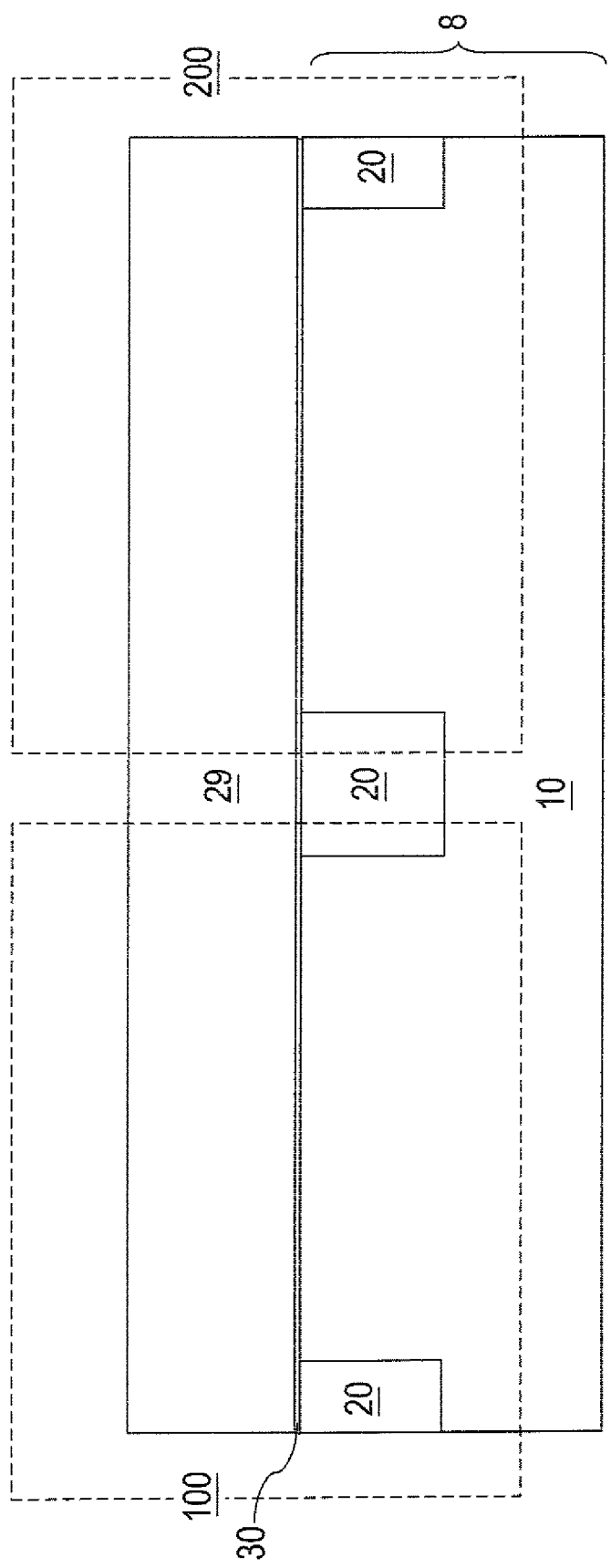
FIG. 1 shows an exemplary semiconductor structure according to the present invention comprising a p-type field effect transistor (PFET) area and an n-type field effect transistor (NFET) area after formation of shallow trench isolation, a gate dielectric, and a gate conductor layer.

As stated above, the present invention relates to methods of manufacturing embedded regions of carbon-substituted single crystal silicon (Si:C) by a laser anneal, which are now described in detail with accompanying figures. It is noted that like and corresponding elements are referred to by like reference numerals.

Referring to FIG. 1, an exemplary structure according to the present invention is shown, which comprises a semiconductor substrate 8 containing a substrate layer 10 and shallow trench isolation 20. The substrate layer 10 comprises a silicon containing material. Preferably, the substrate layer 10 is silicon. The semiconductor substrate 8 may be a bulk substrate, a semiconductor-on-insulator (SOI) substrate, or a hybrid substrate having a bulk portion and an SOI portion. The substrate layer 10 may be under a biaxial stress through an epitaxial alignment of lattice mismatched heterogeneous semiconductor layers, for example, as in a silicon-germanium on insulator (SGOI) substrate or a strained silicon directly on insulator (SSDOI) substrate.

A gate dielectric 30 is formed directly on a top surface of the semiconductor substrate 8. The gate dielectric 30 may comprise a thermally grown or conformally deposited silicon dioxide, nitridated silicon oxide, other suitable insulating materials such as high-K dielectric materials having a dielectric constant greater than 3.9, or combinations thereof. A gate conductor layer 29 is formed, for example, by chemical vapor deposition. The gate conductor layer 29 may comprise polysilicon or a polycrystalline silicon germanium alloy. Preferably, the gate conductor layer 29 comprises a silicon containing material such as silicon or a silicon alloy. The gate conductor layer 29 may, or may not, be doped. In-situ doping or a subsequentially ion implantation may be employed to doped the gate conductor layer 29.

The exemplary structure comprises an NFET area 100 in which an n-type field effect transistor (NFET) is to be subsequently formed and a PFET area 200 in which a p-type field effect transistor (PFET) is to be subsequently formed.

Figure 2:
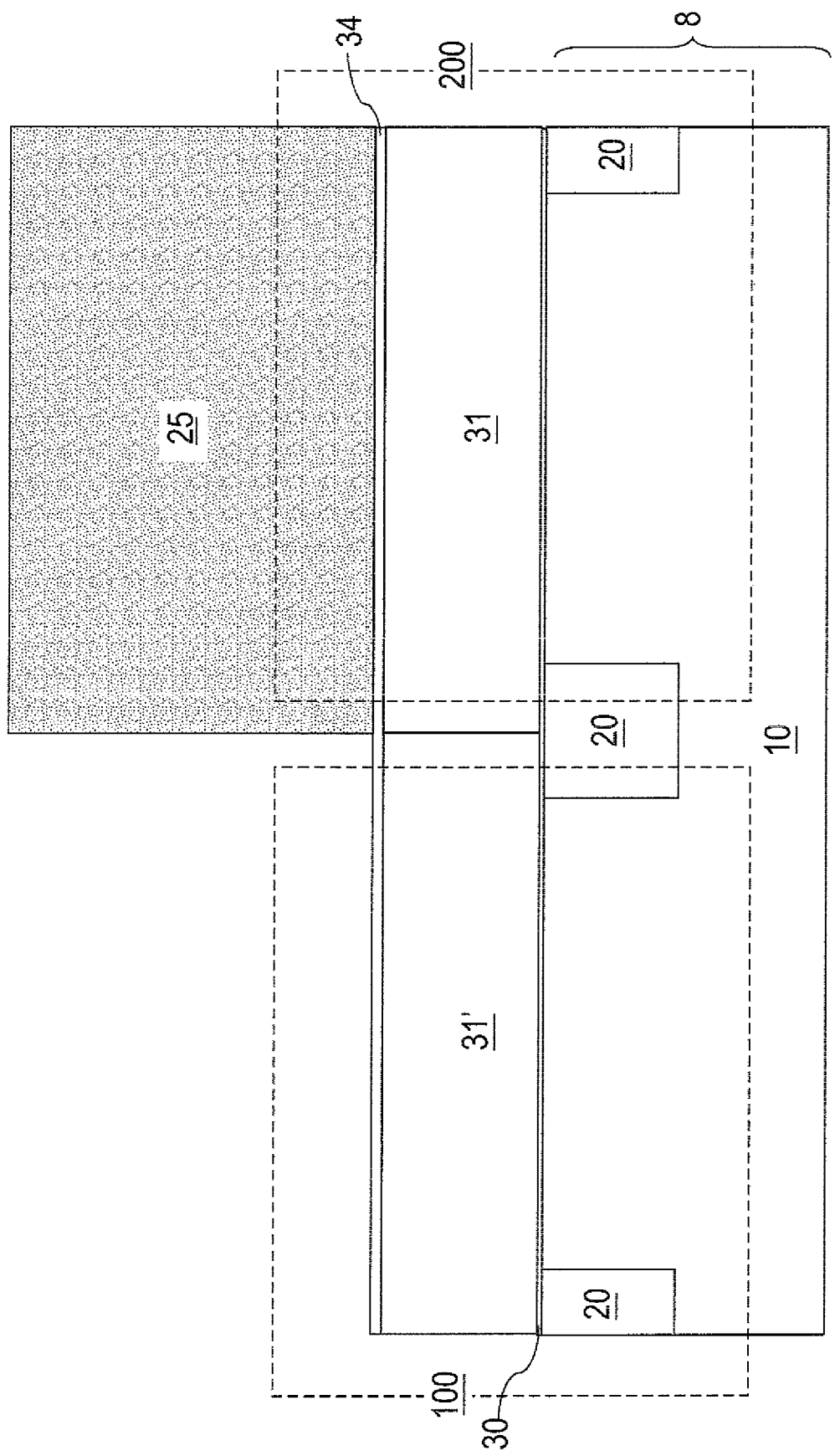
FIG. 2 shows the exemplary semiconductor structure after doping of the n-type field effect transistor gate electrode.

Referring to FIG. 2, a screen oxide 34 is grown over the gate conductor layer 29 by thermal oxidation or by deposition. The thickness of the screen oxide 34 is typically from about 2 nm to about 30 nm. The screen oxide protects the gate conductor layer 29 during subsequent lithographic processing step(s) and ion implantation steps.

A first photoresist 25 is applied to the screen oxide 34 and lithographically patterned so that the NFET area 100 is exposed, while the PFET area 200 is covered by the first photoresist 25. Dopants of a second conductivity type are implanted into the portion of the gate conductor layer 29 to form a NFET area gate conductor layer 31'. The second conductivity type is the opposite of the first conductivity type. Preferably, the second conductivity type is n-type, i.e., dopants of the second conductivity type are selected from group V elements. The remaining portion of the gate conductor layer 29 forms a PFET area gate conductor layer 31. The first photoresist 25 is subsequently removed. In case the gate conductor layer 31 is doped with dopants of the first conductivity type, the dosage of the second conductivity type dopants during the ion implantation exceeds the amount of the first conductivity type dopants so that the polarity of doping is reversed.

In case the PFET area gate conductor layer 31 is substantially undoped, another photoresist (not shown) may be applied and patterned to expose the PFET area 200 and dope the PFET area gate conductor layer 31 in the exposed PFET area 200. In case the gate conductor layer 31 is doped with dopants of the first conductivity type, the dosage of the second conductivity type dopants during the ion implantation exceeds the amount of the first conductivity type dopants so that the polarity of doping is flipped.

Figure 3:
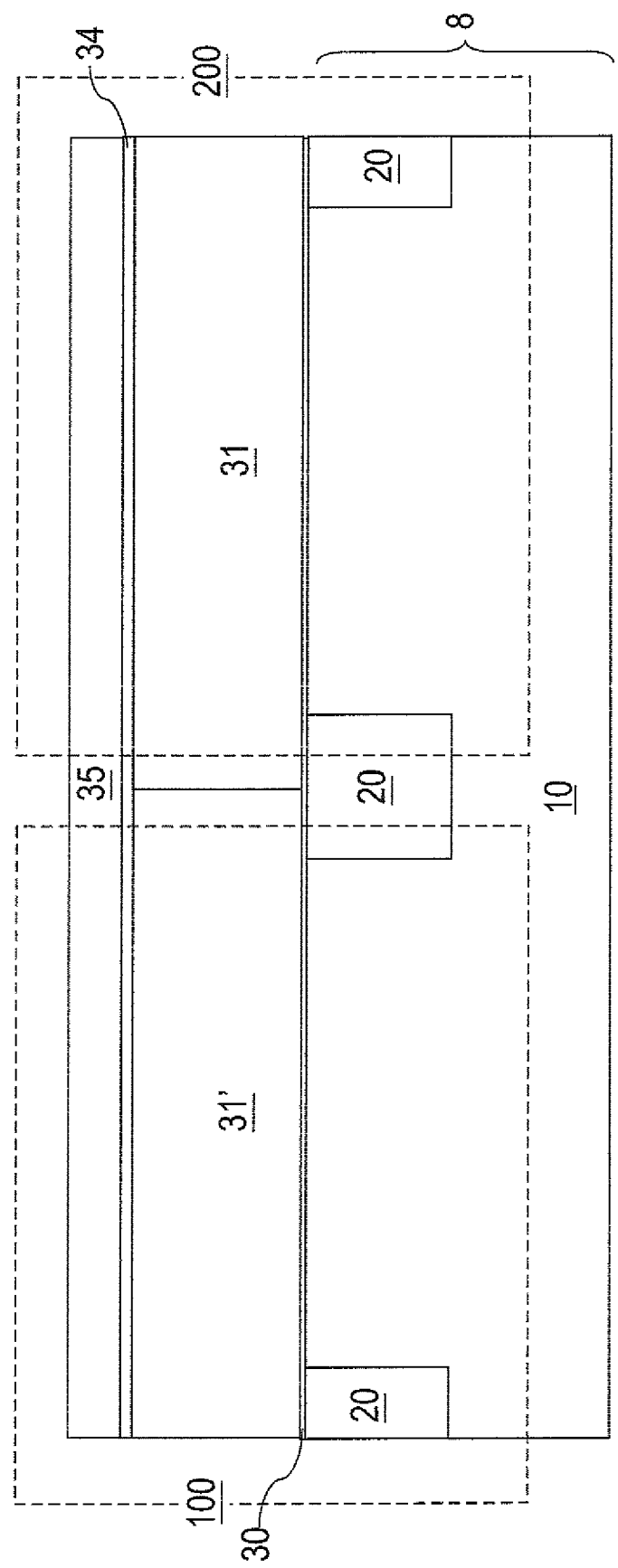
FIG. 3 shows the exemplary semiconductor structure after formation of a gate cap layer.

Referring to FIG. 3, a gate cap layer 35 is formed over the screen oxide 34. The gate cap layer 35 may comprise silicon nitride. The gate cap layer 35 may be formed by chemical vapor deposition (CYD) such as plasma enhanced chemical vapor deposition (PECVD), low pressure chemical vapor deposition (LPCVD), rapid thermal chemical vapor deposition (RTCVD), or high density plasma chemical vapor deposition (HDPCVD). The thickness of the gate cap layer 35 may be from about 30 nm to about 100 nm.

Figure 4:
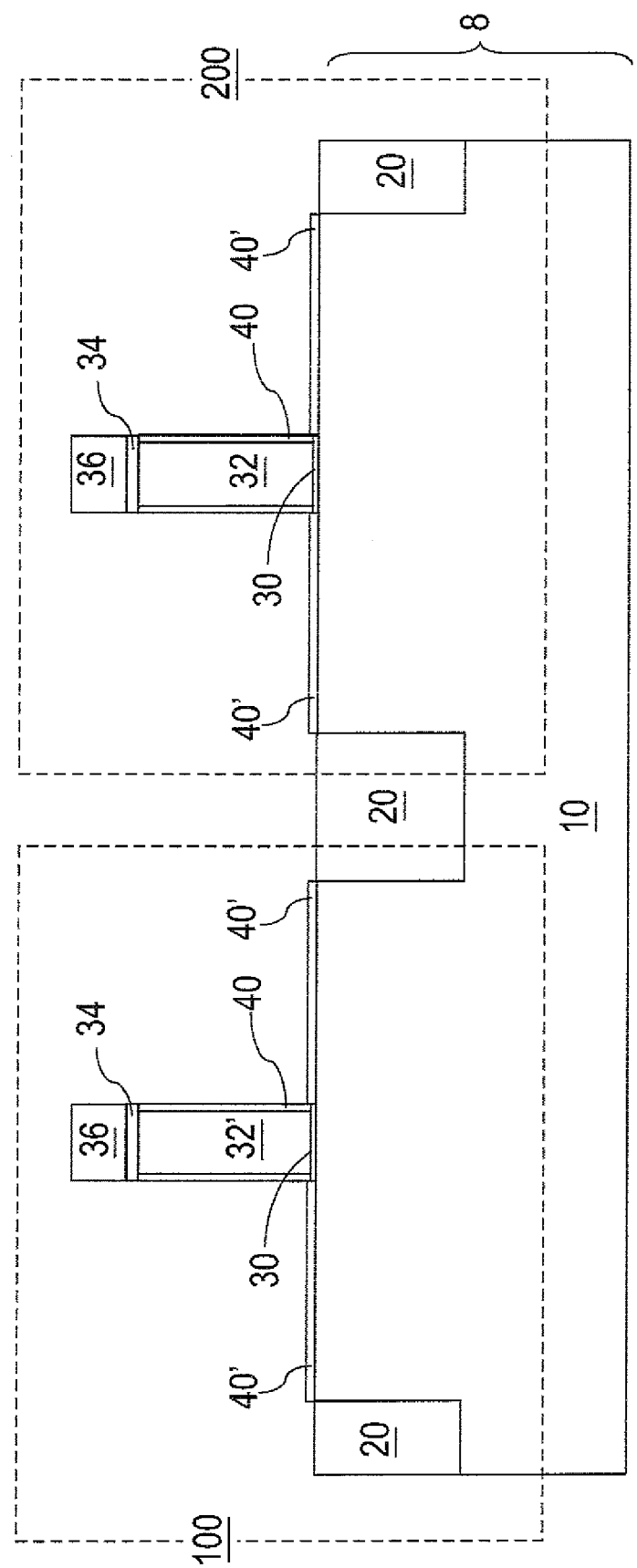
FIG. 4 shows the exemplary semiconductor structure after formation of gate electrodes and gate sidewall oxides.

Referring to FIG. 4, the stack of the gate cap layer 35, the screen oxide 34, the NFET area gate conductor layer 31' or the PFET area gate conductor layer 31, and the gate dielectric 30 is patterned by lithographic methods and at least one reactive ion etch. The at least one reactive ion etch may comprise a gate cap etch in which the gate cap layer 35 is etched to form gate caps 36 employing a patterned photoresist (not shown) as a template, and a gate conductor etch in which the NFET area gate conductor layer 31' and the PFET area gate conductor layer 31 are etched employing the gate caps 36 as a template. The remaining portion of the PFET area gate conductor layer 31 forms a PFET gate electrode 32, while the remaining portion of the NFET area gate conductor layer 31' forms an NFET gate electrode 32'.

Not necessarily but preferably, a thermal oxidation is performed to form sidewall oxides 40 on the gate electrodes (31', 32') and a protective oxide 40' on exposed portions of the substrate layer 10. The thickness of the sidewall oxides 40 may be from about 1 nm to about 10 nm.

Figure 5:
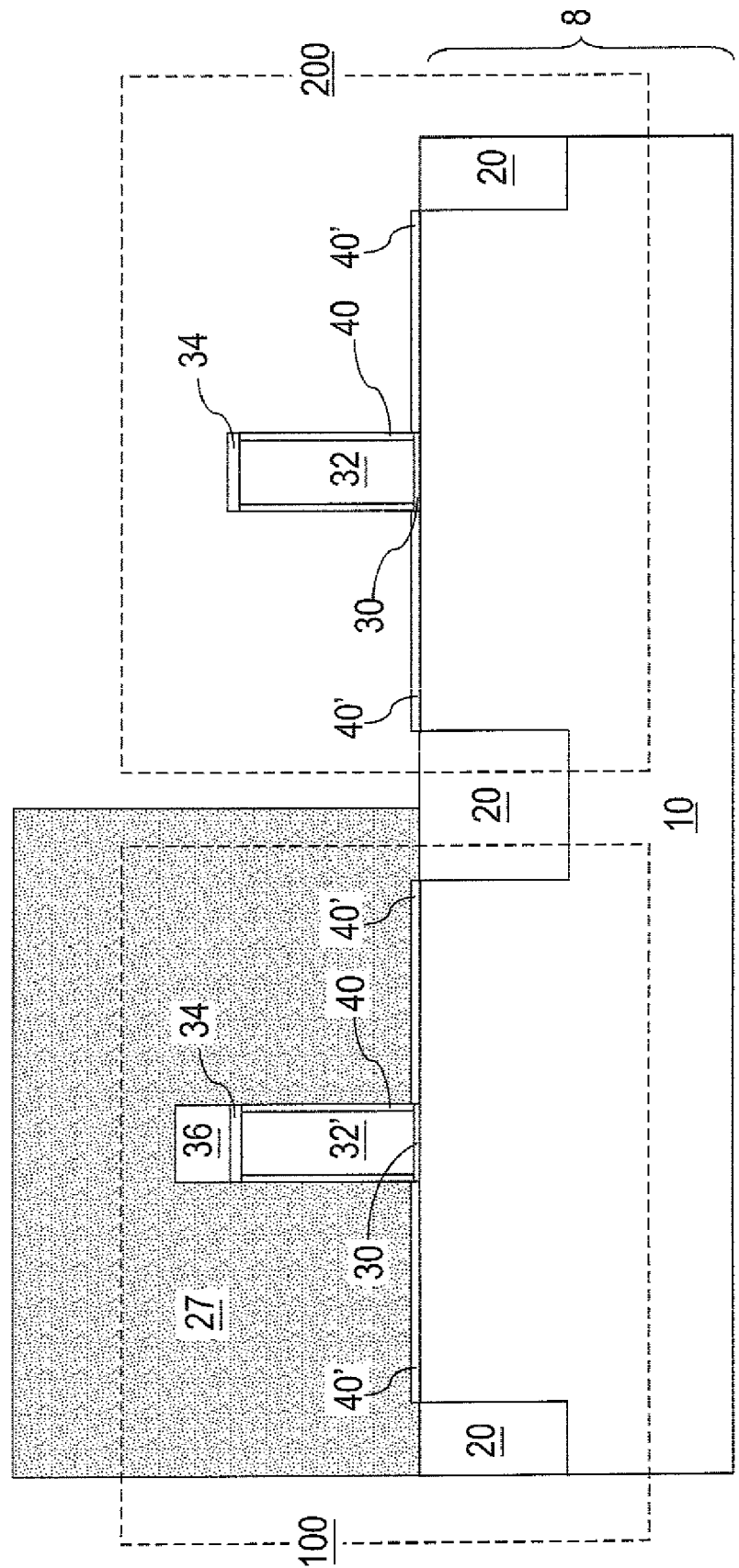
FIG. 5 shows the exemplary semiconductor structure after masking of the NFET and removal of a gate cap from the PFET.

Referring to FIG. 5, a second photoresist 27 is applied over the exemplary structure and lithographically patterned to cover the NFET area 100, while exposing the PFET area 200. The gate cap 36 in the PFET area is removed by a reactive ion etch. Preferably, the reactive ion etch is selective to the screen oxide 34 and the protective oxide 40'. The second photoresist 27 is subsequently removed.

Figure 6:
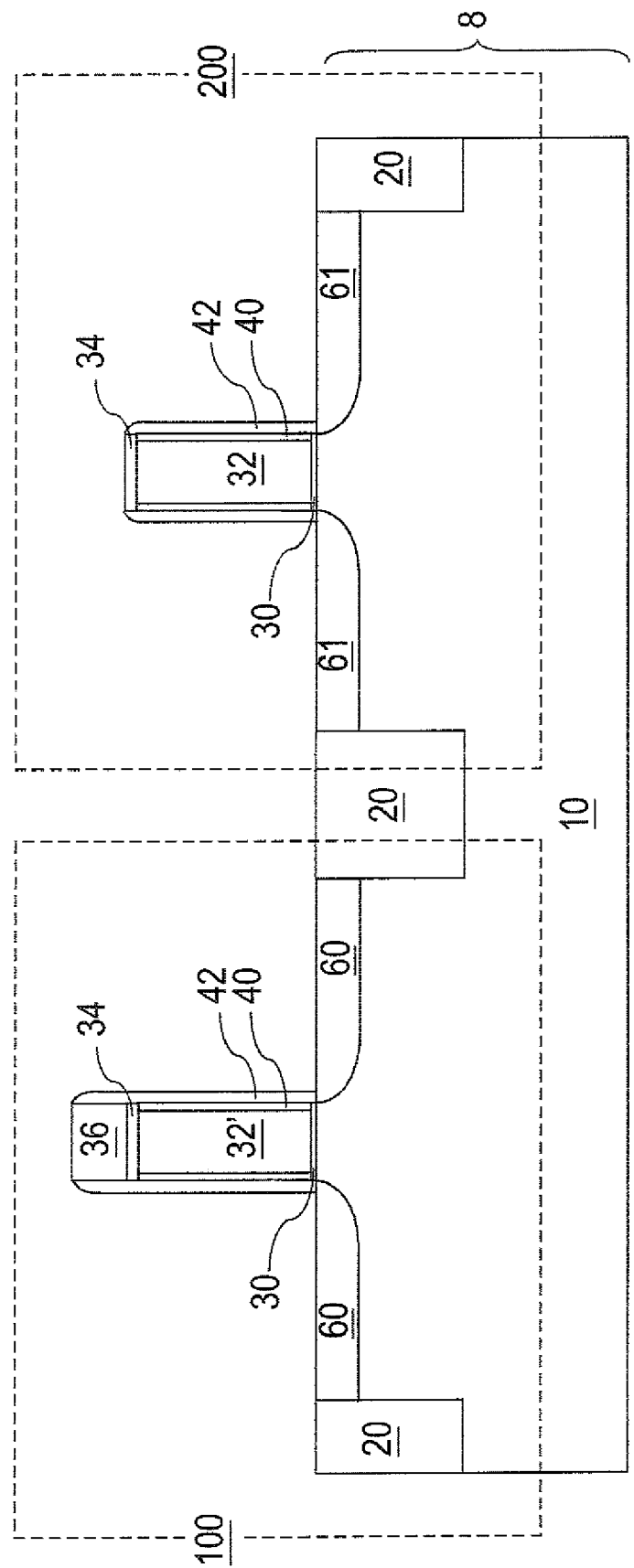
FIG. 6 shows the exemplary semiconductor structure after formation of offset spacers and source and drain extensions by ion implantation.

Referring to FIG. 6, offset spacers 42 are formed on the sidewalls of the stack of the gate dielectric 30, the PFET/NFET gate electrode (32/32'), the screen oxide 34, and gate cap 36. The offset spacers 42 are formed by deposition of a conformal dielectric layer followed by an anisotropic reactive ion etch. The offset spacers 42 may comprise an oxide such as silicon oxide. Alternatively, the offset spacers 42 may comprise silicon nitride. The offset spacers 42 may have a thickness from about 5 nm to about 50 nm. The protective oxide 40' is removed by the anisotropic reactive ion etch.

Source and drain extension implantations and/or halo implantations may be performed prior to or after the formation of the offset spacers 42. Further multiple offset spacers 42 may be formed interspersed with source and drain extension implantations and/or hale implantations. PFET source and drain extension regions 61 and NFET source and drain extension regions 60 are formed in the semiconductor substrate 8 within the regions of the substrate layer 10 that are implanted with dopants during the source and drain extension implantations. Block masks are typically employed to insure that optimized level of dopants are implanted within the PFET and NFET source and drain extension regions (61, 60) within each type of transistors, i.e., within the PFET area 200 and within the NFET area 100.

Figure 7:
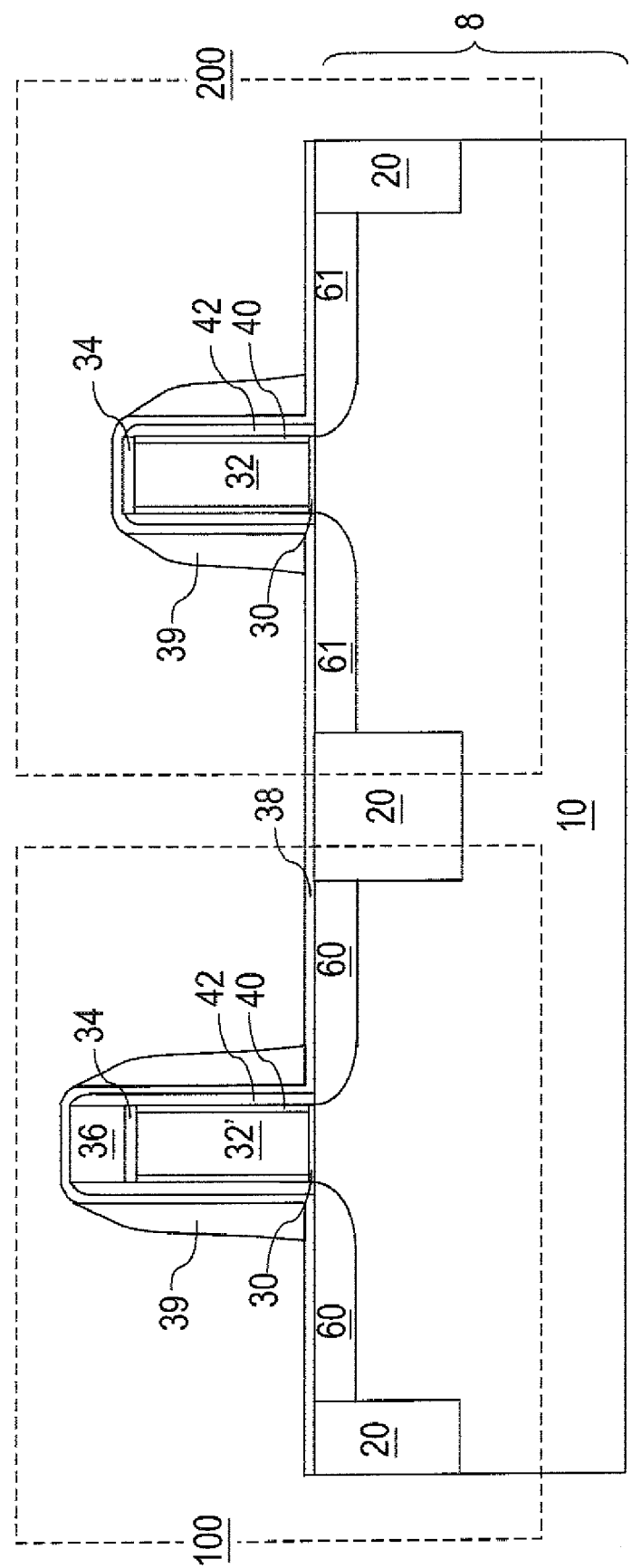
FIG. 7 shows the exemplary semiconductor structure after formation of a liner oxide and gate spacers.

Referring to FIG. 7, a liner oxide 38 is conformally deposited over the exemplary structure, for example, by low pressure chemical vapor deposition (LPCVD) or rapid thermal chemical vapor deposition (RTCVD). The liner oxide 38 may comprise silicon oxide. The thickness of the liner oxide 38 may be from about 3 nm to about 50 nm.

Disposable spacers 39 are formed on the vertical portions of the liner oxide 38 by depositing and anisotropically etching a conformal dielectric layer. The conformal dielectric layer may comprise silicon nitride. The deposition of the conformal nitride may employ low pressure chemical vapor deposition (LPCVD) or rapid thermal chemical vapor deposition (RTCVD), or plasma enhanced chemical vapor deposition (PECVD). The thickness of the gate spacers 39 as measured at the base of the gate spacers may be from about 5 nm to about 100 nm.

Figure 8:
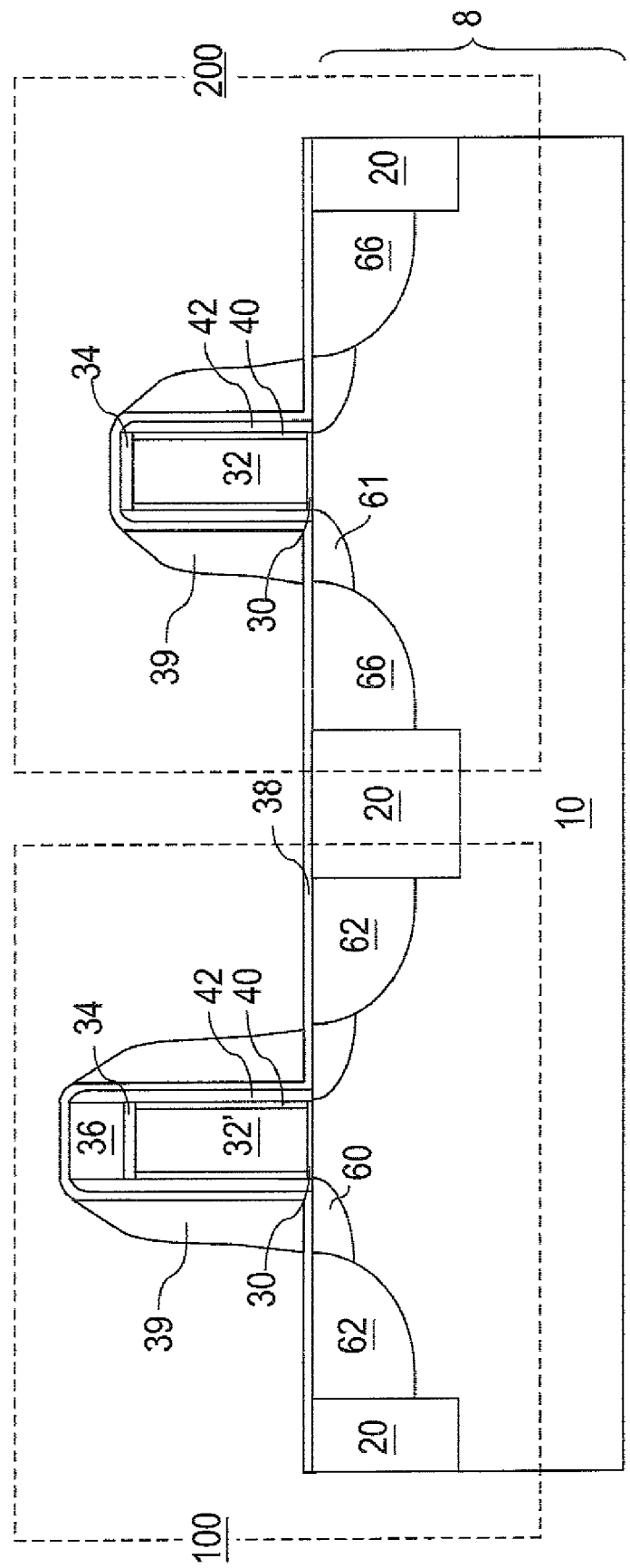
FIG. 8 shows the exemplary semiconductor structure after formation of source and drain regions by implantation and an activation anneal.

Referring to FIG. 8, block masks are employed to expose only one of the NFET area 100 and the PFET area 200, and source and drain ion implantation processes are performed into the exposed portions of the semiconductor substrate 8 to form source and drain regions. For example, n-type dopants are implanted into the NFET area 100 while the PFET area 200 is masked by a first block mask (not shown) to form NFET source and drain regions 62. Subsequently, p-type dopants are implanted into the PFET area 200 while the NFET area 100 is masked by a second block mask (not shown) to form PFET source and drain regions 66.

Typically, two types of block masks are employed alternately to form the NFET source and drain regions 62 in the NFET area 100 and the PFET source and drain regions 66 in the PFET area 200. An amorphization implantation may be performed prior to the source and drain implantation processes to reduce channeling of ions during the source and drain implantation processes. Portions of the PFET and NFET source and drain extension regions (61, 60) that are implanted during the source and drain ion implantation processes are absorbed into one of the NFET source and drain regions 62 and the PFET source and drain region 66.

An activation anneal is performed to activate the dopants that are implanted into the PFET and NFET source and drain regions (66, 62) and the PFET and NFET source and drain extension regions (61, 60) and at the same time to heal structural damages that may be present in the PFET and NFET source and drain regions (66, 62). The semiconductor substrate 8 may be substantially free of stress at this point since it does not contain any embedded stress-generating materials.

Figure 9:
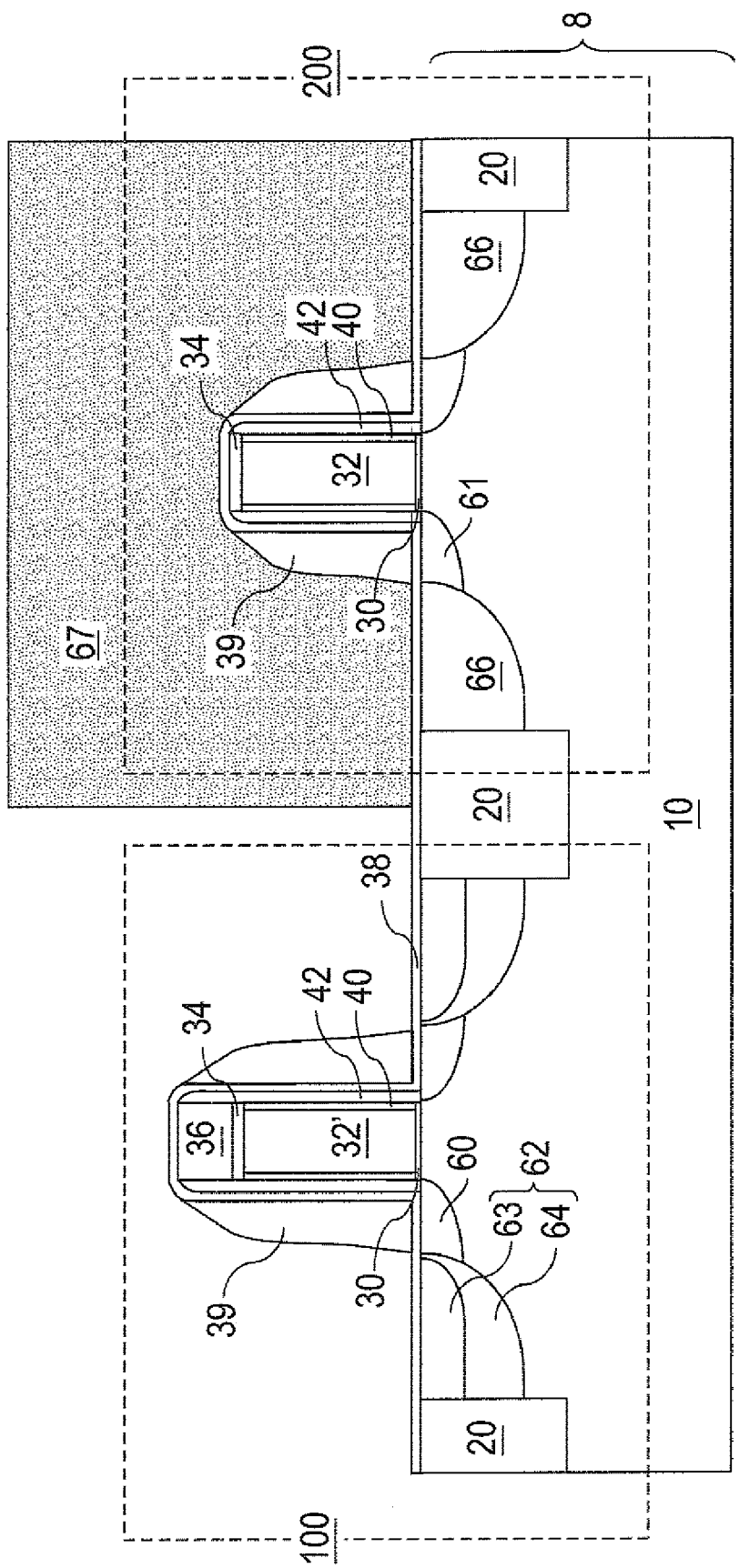
FIG. 9 shows the exemplary semiconductor structure after masking of the PFET and implantation of an amorphizing species and carbon.

Referring to FIG. 9, a third photoresist 67 is applied over the exemplary structure and lithographically patterned to expose the NFET area 100, while covering the PFET area 200 with the patterned third photoresist 67. Upper NFET source and drain regions 63, which are upper portions of the NFET source and drain regions 62, are implanted with atoms of an amorphizing species and structurally amorphized. Preferably, the amorphizing species comprises group IV elements, such as silicon and/or germanium. Preferably, the energy of the implanted amorphizing species ions are selected such that only the upper NFET source and drain regions 63 are amorphized by the atoms of the amorphizing species, while lower NFET source and drain regions 64 are not amorphized, i.e., remains single crystalline. For example, implantation of Ge ions having energy from about 20 keV to about 60 KeV at a dose from about $1.0 \times 10^{14}/cm^2$ to about $1.0 \times 10^{15}/cm^2$ may be used to amorphize a layer of silicon having a thickness from about 3 nm to about 7 nm. At this point, the NFET source and drain regions 62 comprise the upper NFET source and drain regions 63 containing an amorphized doped silicon material and the lower NFET source and drain regions 64 containing single crystalline doped silicon material.

Carbon atoms are implanted by a single or multiple implants with appropriate energies and doses into the upper NFET source and drain regions 63 to form an amorphous alloy comprising silicon and carbon within the upper NFET source and drain regions 63. The atomic concentration of carbon in the amorphous alloy is preferably from about 0.5% to about 4.0%, and more preferably from about 1.0% to about 3.0%. The energy of the carbon implantation is selected such that only the upper NFET source and drain regions 63 are substantially implanted with carbon atoms, i.e., the lower NFET source and drain regions 64 does not receive any significant level of carbon implantation. At the end of carbon implantation, the NFET source and drain regions 62 comprise the upper NFET source and drain regions 63 containing an amorphized doped silicon carbon alloy and the lower NFET source and drain regions 64 containing single crystalline doped silicon.

The amorphous alloy within the upper NFET source and drain regions 63 may be a silicon carbon alloy essentially consisting of silicon and carbon. A single crystalline doped silicon carbon alloy to be formed by a subsequent laser anneal from the amorphous silicon carbon alloy has a lattice constant that is less than the lattice constant of silicon, so that a uniaxial tensile stress may be applied along the channel of the NFET containing the upper NFET source and drain regions 63.

The amorphous alloy within the upper NFET source and drain regions 63 may also comprise germanium. In this case, the amorphous alloy is a silicon carbon germanium alloy. The concentration of germanium is in the range such that a single crystalline doped silicon germanium carbon alloy to be formed by a subsequent laser anneal from the amorphous silicon carbon germanium alloy has a lattice constant that is less than the lattice constant of silicon, so that a uniaxial tensile stress may be applied along the channel of the NFET containing the upper NFET source and drain regions 63.

Figure 10:
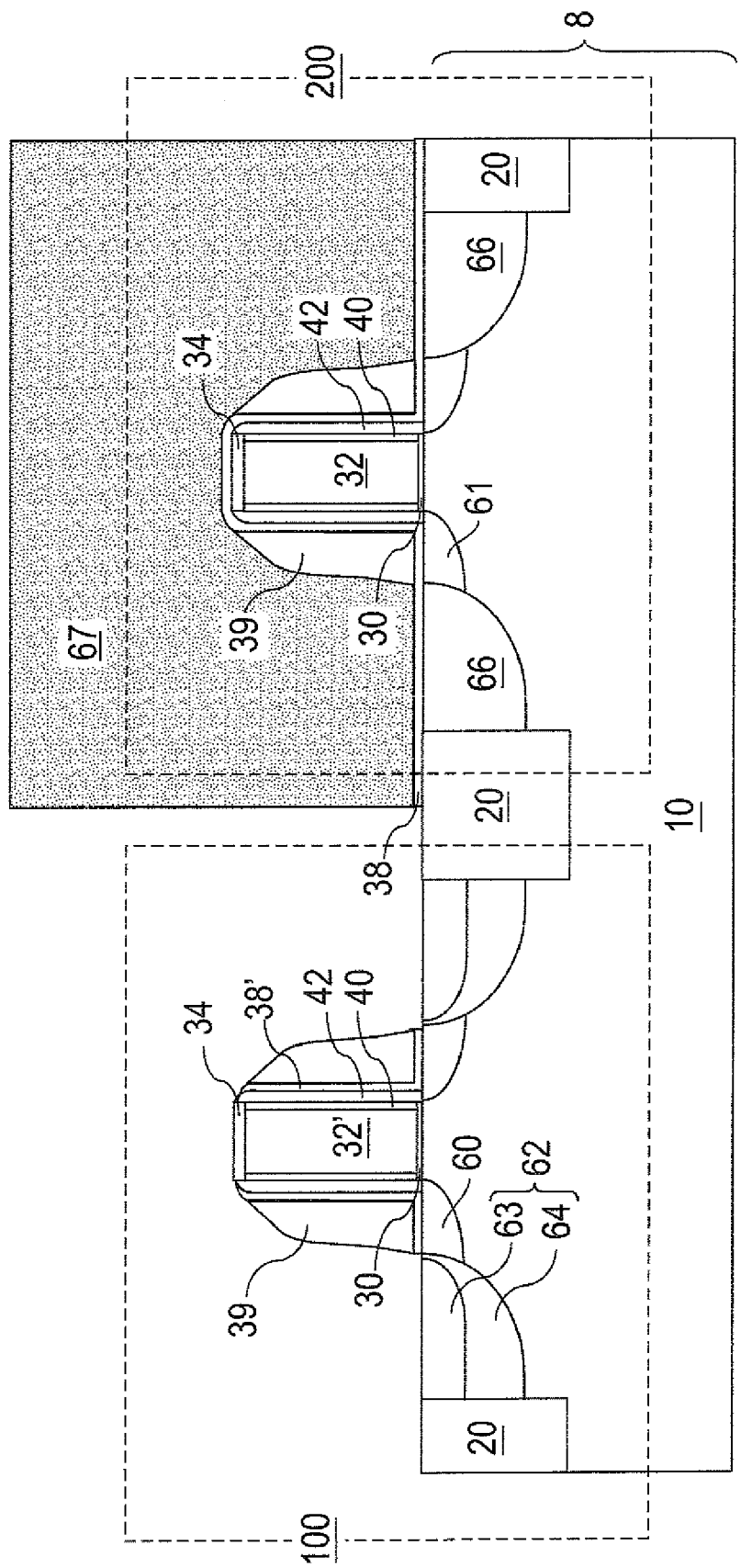
FIG. 10 shows the exemplary semiconductor structure after removal of the gate spacers and the liner oxide and the gate cap.

Referring to FIG. 10, a photoresist 67 is applied onto the NFET are 100 and the PFET 200, and lithographically patterned to cover the PFET are 200, while exposing the NFET area 100. Exposed portions of the liner oxide 38 in the NFET area 100 are then removed, for example, by a wet etch employing hydrofluoric acid such as buffered hydrofluoric acid (BHF) which does not attack the photoresist 67. Alternatively, a reactive ion etch may be employed. The gate cap 36 is exposed after removal of the portion of the liner oxide from above the gate cap 36. The remaining portions of the liner oxide 38 forms sidewall liner oxide 38' located directly on the offset spacers 42. The gate cap 36 in the NFET area is then removed by a reactive ion etch. The height of the gate spacers 39, which may comprise the same material as the gate cap 36, may be reduced during the same processing step.

Figure 11:
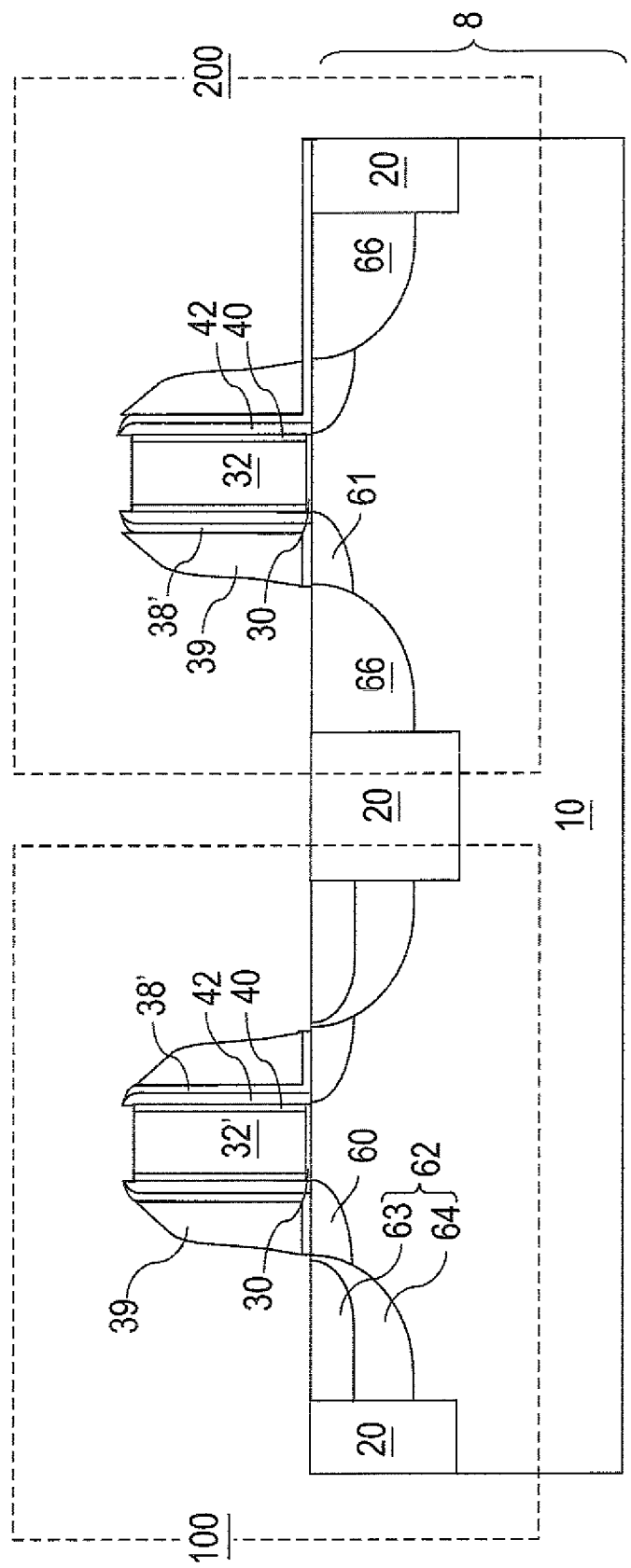
FIG. 11 shows the exemplary semiconductor structure after formation of an etch stop oxide layer and a nitride spacer.

Referring to FIG. 11, the third photoresist 67 is removed, for example, by asking. Appropriate clean may be performed on the exposed surfaces as necessary. Exposed portions of the liner oxide in the PFET area 200 and the screen oxide 34 are removed, for example, by a wet etch employing hydrofluoric acid such as diluted hydrofluoric acid (DHF).

Figure 12:
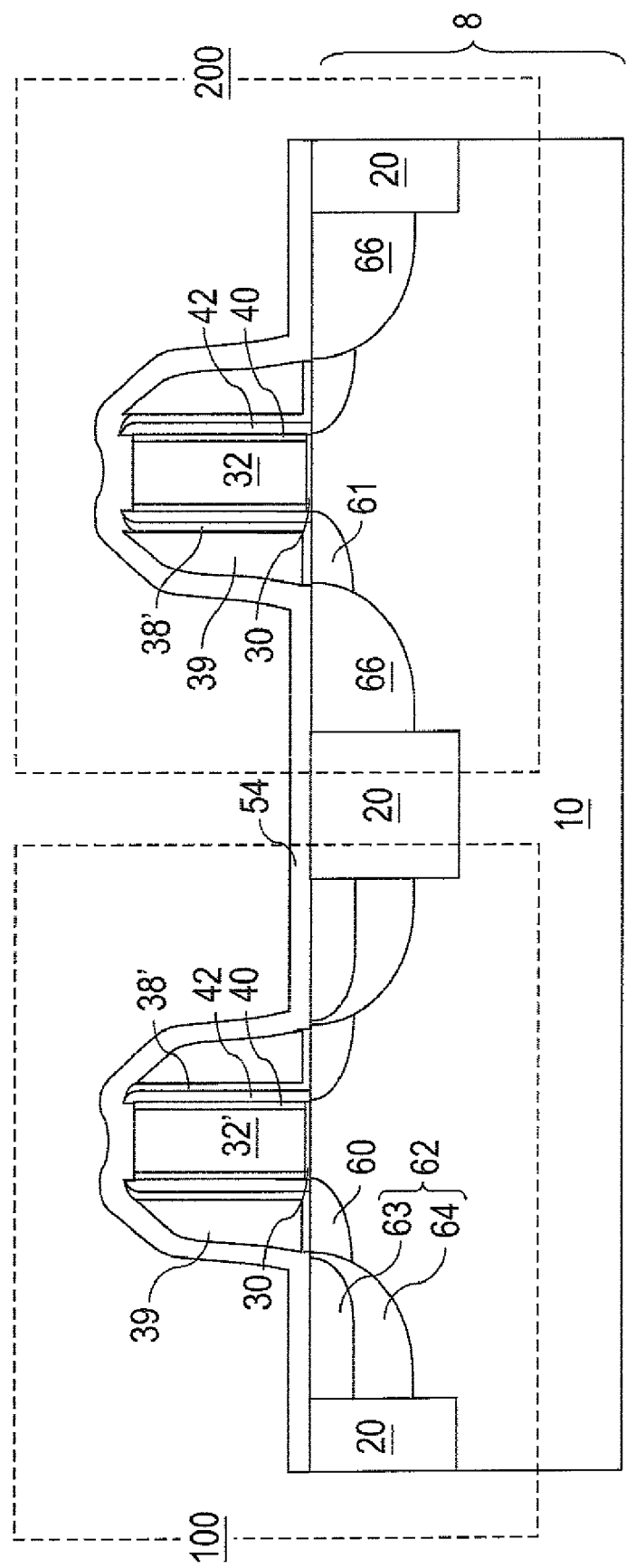
FIG. 12 shows the exemplary semiconductor structure after formation of an anti-reflective layer and performing of a laser anneal.

Referring to FIG. 12, an anti-reflective layer 54 is deposited over the gate spacer 39, the upper NFET source and drain regions 63, and PFET source and drain regions 66. The anti-reflective layer 54 may comprise an oxide such as TEOS (tetra-ethyl-ortho-silicate) oxide, i.e., silicon oxide formed by decomposition of TEOS. The thickness of the anti-reflective layer 54 may be adjusted to maximize the absorption of the laser energy. The optimal thickness of the anti-reflective layer 54 depends on the wavelength of the laser beam. Thickness for the anti-reflective layer 54 may be from about 10 nm to about 100 nm, and typically around 40 nm.

A laser anneal is performed on the exemplary structure by shining a laser beam. In practice, the laser beam may be rastered across a semiconductor substrate containing the exemplary structure. The intensity of the laser beam, or the energy of the laser beam, is adjusted so that the temperature of the exemplary structure is confined within a temperature range. For example, a laser with a wavelength of 308 nm, pulse length from about 120 ns to about 200 ns and energy flux from about 0.5 J/cm$^2$ to about 3 J/cm$^2$ may be used to melt and recrystallize the top carbon-containing amorphous Si. The temperature range is bounded at the upper end by a temperature that may cause structural instability such as melting of the semiconductor substrate or flowing of silicon oxide at a glass transition temperature, and a melting point of a polycrystalline silicon alloy material in the gate electrode (32, 32'), and at the lower end by the melting temperature of the amorphous silicon carbon alloy in the upper NFET source and drain regions 63 proceeds below an acceptable rate. For example, the melting temperature of silicon is 1,428° C., and therefore, a semiconductor structure comprising a silicon substrate may not be heated to 1,428° C. Likewise, the glass transition temperature of silicon oxide is about 1,200° C., and therefore, a semiconductor structure comprising an unconfined silicon oxide structure may not be heated to 1,200° C. without risking structural degradation of the semiconductor structure.

While the melting temperature of silicon is 1,428° C., by amorphizing the silicon carbon alloy, the melting temperature of the silicon carbon alloy is reduced. At about 1% atomic concentration of carbon, a melting temperature of about 1,147° C. has been observed for an amorphous silicon carbon alloy. For practicing the present invention, the temperature of the laser anneal may be in the range from about 1,100° C. to about 1,200° C., and preferably in the range from about 1,125° C. to about 1,175° C. The relatively low melting point is manifested locally only in regions with the amorphous silicon carbon alloy, i.e., only in the upper NFET source and drain regions 63. The relatively low melting point is lower than the melting point of polycrystalline gate material, i.e., polysilicon or a polycrystalline silicon germanium alloy, and the melting temperature of crystalline silicon substrate. The silicon material in the substrate 8 maintains normal structural transition temperatures. For example, the melting temperature of the silicon substrate remains at 1,428° C. and the glass transition temperature of silicon oxide in the shallow trench isolation 20 stays at about 1,200° C. Amorphization of silicon lowers the melting point of the upper NFET source and drain regions 63.

As the temperature at the upper NFET source and drain regions 63 is raised above the melting point of the silicon carbon alloy, the silicon carbon alloy in the upper NFET source and drain regions 63 melts. As the temperature at the upper NFET source and drain regions 63 is lowered below the melting point of the amorphous silicon carbon alloy at the end of the laser anneal, the upper NFET source and drain regions 63 is epitaxially aligned to the underlying single crystalline lower NFET source and drain region 64. After the laser anneal, the upper NFET source and drain regions 63 comprise a single crystalline doped silicon carbon alloy that is epitaxially aligned to the underlying lower NFET source and drain regions 64, which comprise a single crystalline doped silicon.

The carbon concentration in the upper NFET source and drain regions 63 is substantially the same as the carbon concentration of the silicon carbon alloy prior to the laser anneal, i.e., preferably from about 0.5% to about 4.0%, and more preferably from about 1.0% to about 3.0%, with more substitutional carbon atoms than interstitial carbon atoms. The substitutional carbon concentration by laser melting is expected to be higher than that can be obtained by any kind of solid phase epitaxy. Each of the upper NFET source and drain region 63 applies a substantially radial tensile stress to surrounding regions due to the epitaxial alignment of the single crystalline silicon-carbon alloy or the silicon-germanium-carbon alloy having a lattice constant smaller than the lattice constant of silicon to the silicon containing material of the substrate layer 10 having a larger lattice constant, e.g., silicon.

The single crystalline doped silicon carbon alloy in the upper NFET source and drain regions 63 are regions of an embedded stress-generating material and applies a uniaxial tensile stress to the channel of the NFET. The uniaxial tensile stress is the result of placement of two substantially radial tensile stress generating structures, i.e., the upper NFET source and drain region 63, on both ends of the channel of the NFET. The uniaxial tensile stress enhances the mobility of electrons in the channel of the NFET, thus increasing the transconductance and the on-current of the NFET. Since the nature of the tensile stress generated by the embedded silicon carbon alloy is local, a tensile stress may be generated locally in any device on which a tensile stress is desired.

The single crystalline doped silicon carbon alloy to be formed from the amorphous silicon carbon alloy may consist essentially of silicon, carbon, and dopants. In this case, the amorphizing species may be silicon. The single crystalline doped silicon carbon alloy has a lattice constant that is less than the lattice constant of silicon, so that a uniaxial tensile stress is applied along the channel of the NFET containing the upper NFET source and drain regions 63.

The single crystalline doped silicon carbon alloy may also comprise germanium low concentration, e.g., less than about $1.0 \times 10^{20}/cm^3$ in atomic concentration, in which case, the single crystalline doped silicon carbon alloy is a single crystalline doped silicon germanium carbon alloy having a lattice constant that is less than the lattice constant of silicon, so that a uniaxial tensile stress is applied along the channel of the NFET containing the upper NFET source and drain regions 63.

There are different phases between Si and C, silicon carbon substitutional alloy, silicon carbon interstitial alloy, and silicon carbide compounds. Silicon carbon substitutional alloy is desired in order to get a crystal with the same structure as Si but smaller lattice constant, i.e., carbon atoms need to occupy substitutional sites in a silicon lattice. However, substitutional carbon is thermodynamically unfavorable, and therefore Si:C, i.e., carbon substituted silicon, lattices are difficult to manufacture, and is known to be unstable. Silicon carbon compounds containing interstitial carbon are easier to manufacture and more stable, but presence of interstitial carbon atoms is detrimental to performance of devices. It is difficult to grow Si:C with more than 1% of substitutional carbon in atomic concentration. A high thermal anneal after the formation of the Si:C lattices may cause movement of the carbon atoms from substitutional sites to interstitial sites, or even cause formation of silicon carbide.

The present invention provides strained NFET devices using embedded Si:C. It has been demonstrated that laser melting can result in high substitutional carbon concentration than ordinary solid phase epitaxy. However, silicon substrate may not be melt by a laser anneal without compromising structural integrity. By employing amorphizing ion implantation and locally lowering the melting temperature of a carbon implanted region by amorphization of a local region, the current invention provides a simple and potentially fast method of forming strained Si:C with high substitutional carbon in the source/drain regions without jeopardizing structural integrity of the silicon substrate itself or other temperature sensitive components thereupon.

Figure 13:
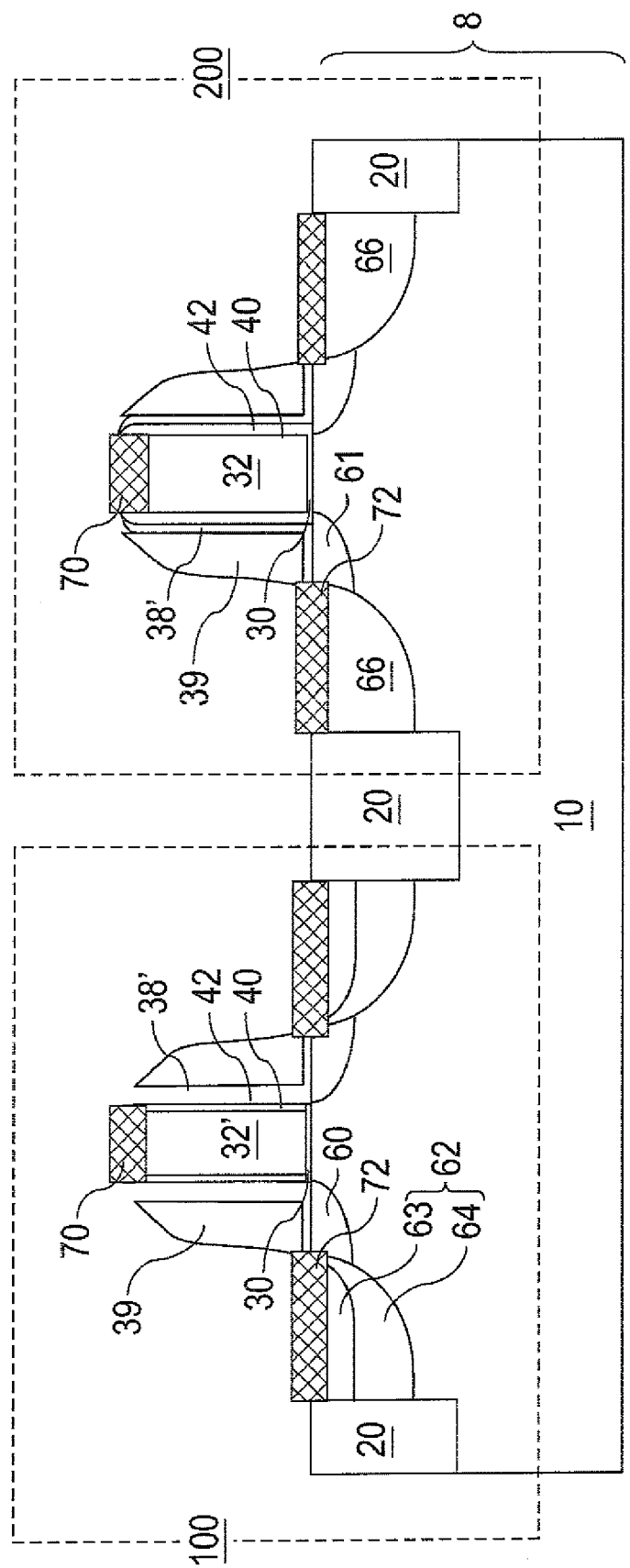
FIG. 13 shows the exemplary semiconductor structure after formation of silicides.

Referring to FIG. 13, after removing the antireflective coating 54, metal semiconductor alloys are formed on exposed semiconductor surfaces by deposition of a metal layer (not shown) followed by anneal that induces reaction of the metal layer with the underlying semiconductor material. Specifically, source and drain metal semiconductor alloys 72 are formed on the PFET source and drain regions 66 and the upper NFET source and drain regions 63. Gate metal semiconductor alloys 70 are formed on the PFET gate electrode 32 and the NFET gate electrode 32'.

In case the semiconductor substrate comprises silicon, the metal semiconductor alloys are silicides. The metal layer comprises a metal that can react with silicon to form a metal silicide. For example, the metal may be Ti, Co, Ni, Ta, W, Pt, Pd or an alloy thereof. The preferred thickness of the metal layer ranges from about 10 nm to about 50 nm, more preferably from about 5 nm to about 20 nm. Such a metal layer can be readily deposited by any suitable deposition technique, including, but not limited to: atomic layer deposition (ALD), chemical vapor deposition (CVD), and physical vapor deposition (PVD). The metal layer may be deposited alone, or together with a metal nitride capping layer (not shown) containing TiN or TaN and having a thickness ranging from about 5 nm to about 50 nm, and preferably from about 10 nm to about 20 nm.

After deposition of the metal layer and/or the metal nitride capping layer, the entire structure is annealed at a pre-determined elevated temperature at which the deposited metal layer reacts with exposed silicon to form metal silicides of relatively low contact resistance. The annealing is typically performed in an inert gas atmosphere, e.g., He, Ar, $N_2$, or forming gas, at relatively low temperatures ranging from about 100° C. to about 600° C., preferably from about 300° C. to about 500° C., and most preferably from about 300° C. to about 450° C., by using a continuous heating regime or various ramp and soak heating cycles. Unreacted metal and/or metal nitride are removed after formation of the metal silicides. For certain metals such as Co or Ti, a second annealing step may be employed to form metal silicides of lower resistivity, such as $CoSi_2$ or $TiSi_2$.

Figure 14:
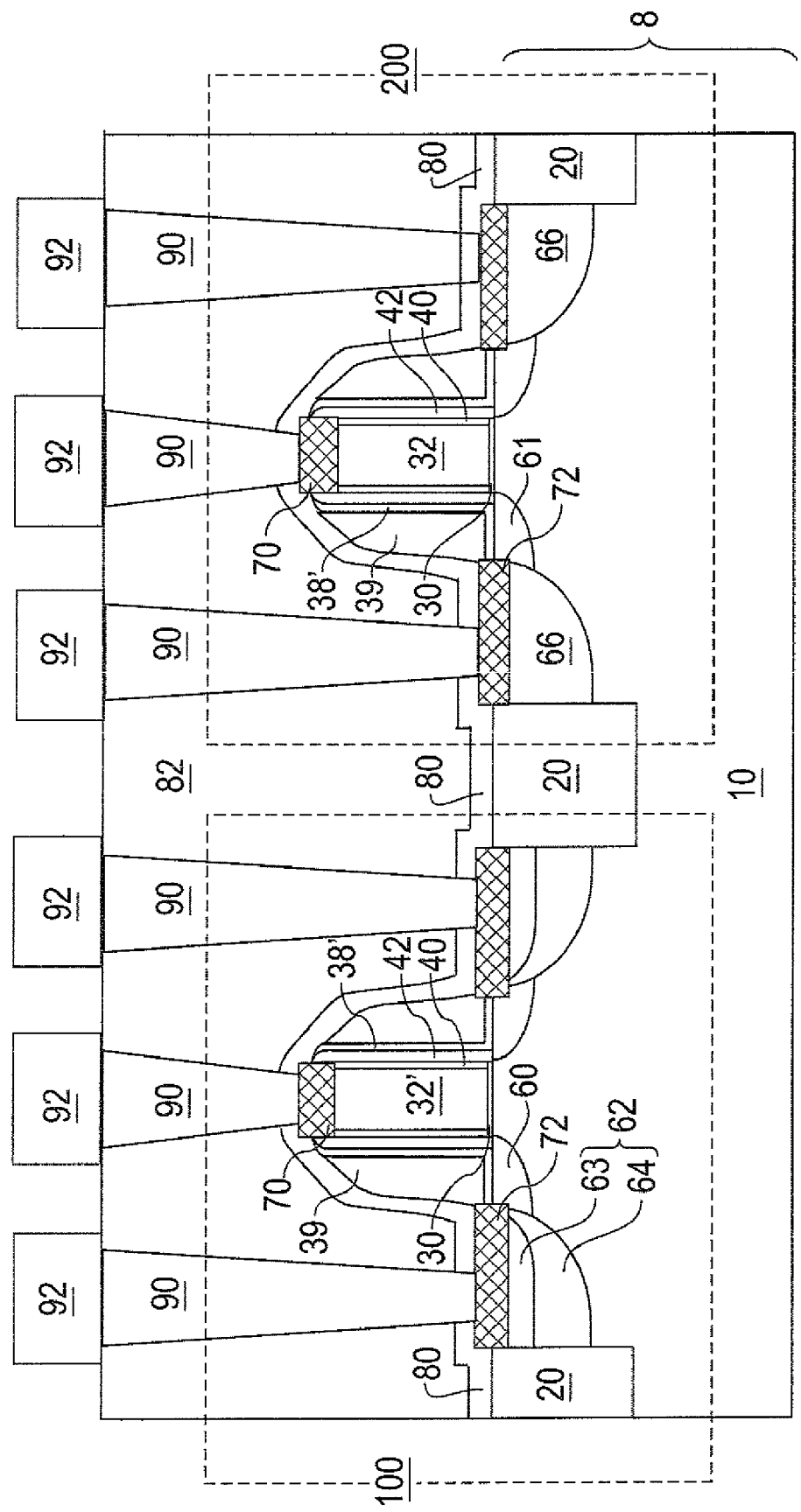
FIG. 14 shows the exemplary semiconductor structure after formation of middle-of-line (MOL) dielectric and contact vias.

Referring to FIG. 14, a mobile ion diffusion barrier layer 80 is deposited over the exemplary structure. The mobile ion diffusion barrier layer 80 may comprise silicon nitride. The thickness of the mobile ion diffusion barrier layer 80 is from about 10 nm to about 80 inn. A middle-of-line (MOL) dielectric layer 82 is deposited over the mobile ion diffusion barrier layer 80. The MOL dielectric layer 82 may comprise, for example, a CVD oxide. The CVD oxide may be an undoped silicate glass (USG), borosilicate glass (BSG), phosphosilicate glass (PSG), fluorosilicate glass (SG), borophosphosilicate glass (BPSG), or a combination thereof. The thickness of the MOL dielectric layer 82 may be from about 200 nm to about 500 nm. The MOL dielectric layer 82 is preferably planarized, for example, by chemical mechanical polishing (CMP).

Various contact via holes are formed in the MOL dielectric layer 82 and filled with metal to from various contact vias 92. Specifically, contact vias 90 are formed on various gate metal semiconductor alloys 70 and on various source and drain metal semiconductor alloys 72. A first level metal wiring 92 is thereafter formed followed by further formation of back-end-of-line (BEOL) structures.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
    forming a gate conductor on a semiconductor substrate comprising a silicon containing material;
    forming a source region and a drain region in the semiconductor substrate;
    performing an activation anneal to provide an activated source region and an activated drain region;
    amorphizing a region of said semiconductor substrate by implanting atoms of an amorphizing species into the activated source region and the activated drain region;
    implanting carbon atoms into said region to form an amorphous alloy comprising silicon and carbon; and
    annealing said semiconductor substrate with a laser anneal, wherein said amorphous alloy is melted and recrystallized at a temperature below the glass transition temperature of silicon oxide.

2. The method of claim 1, wherein said temperature of said annealing is in the range from about 1,100° C. to about 1,200° C.

3. The method of claim 1, wherein said amorphizing species is selected from the group consisting of silicon and germanium.

4. The method of claim 1, wherein said amorphous alloy comprises at least 0.5% of carbon in atomic concentration.

5. The method of claim 1, further comprising forming an anti-reflective layer prior to said annealing.

6. The method of claim 5, wherein said anti-reflective layer comprises a silicon oxide layer having a thickness from about 10 nm to about 100 nm.

7. The method of claim 5, further comprising forming gate spacers prior to said forming of said anti-reflective layer.

8. The method of claim 1, wherein a recrystallized alloy comprising silicon, germanium, and carbon and formed out of said amorphous alloy by said annealing applies a substantially radial tensile stress to surrounding regions.

9. The method of claim 1, further comprising forming shallow trench isolation comprising silicon oxide prior to said annealing.

10. A method of forming a semiconductor structure comprising:
    forming at least one p-type field effect transistor (PFET) and at least one n-type field effect transistor (NFET) on a semiconductor substrate comprising a silicon containing material;
    amorphizing an upper portion of activated source and drain regions of said at least one NFET by implanting atoms of an amorphizing species;
    implanting carbon atoms into said upper portion of said activated source and drain regions to form an amorphous alloy comprising silicon and carbon; and
    annealing said semiconductor substrate with a laser anneal, wherein said amorphous alloy is melted and recrystallized at a temperature below the glass transition temperature of silicon oxide.

11. The method of claim 10, wherein said temperature of said annealing is in the range from about 1,100° C. to about 1,200° C.

12. The method of claim 10, wherein said amorphizing species is selected from the group consisting of silicon and germanium.

13. The method of claim 10, wherein said amorphous alloy comprises at least 1% of carbon in atomic concentration.

14. The method of claim 10, further comprising forming an anti-reflective layer prior to said annealing.

15. The method of claim 14, wherein said anti-reflective layer comprises a silicon oxide layer having a thickness from about 10 nm to about 100 nm.

16. The method of claim 14, further comprising removing said anti-reflective layer after said annealing of said semiconductor substrate.

17. The method of claim 14, further comprising forming gate spacers prior to said forming of said anti-reflective layer.

18. The method of claim 17, further comprising:
    forming an etch stop oxide abutting said upper portion of source and drain regions; and
    forming a nitride spacer on each of said at least one PFET and said at least one NFET.

19. The method of claim 10, wherein said recrystallized alloy applies a uniaxial tensile stress to at least one channel of said at least one NFET.

20. The method of claim 19, wherein the magnitude of said uniaxial tensile stress on said at least one channel of said at least on NFET is about 500 MPa or greater.

* * * * *